United States Patent
Niwa et al.

(10) Patent No.: US 7,819,110 B2
(45) Date of Patent: Oct. 26, 2010

(54) IGNITION COIL

(75) Inventors: Mitsunobu Niwa, Kariya (JP); Haruo Kawakita, Okazaki (JP)

(73) Assignee: Denso Corporation, Kariya (JP)

( * ) Notice: Subject to any disclaimer, the term of this patent is extended or adjusted under 35 U.S.C. 154(b) by 523 days.

(21) Appl. No.: 12/014,156

(22) Filed: Jan. 15, 2008

(65) Prior Publication Data

US 2008/0180137 A1     Jul. 31, 2008

(30) Foreign Application Priority Data

Jan. 25, 2007 (JP) ............................. 2007-015226

(51) Int. Cl.
*H01F 38/12* (2006.01)
*H03B 1/00* (2006.01)

(52) U.S. Cl. .................................. 123/634

(58) Field of Classification Search ............... 123/634, 123/635, 647, 143 C; 257/713
See application file for complete search history.

(56) References Cited

U.S. PATENT DOCUMENTS 5,592,015 A    1/1997   Iida et al.
6,055,969 A *  5/2000   Oishi et al. ................. 123/635
6,378,514 B1 * 4/2002   Kaminaga et al. ........... 123/634
6,873,238 B2   3/2005   Kondo et al.
7,084,729 B2   8/2006   Kondo et al.
7,528,469 B2 * 5/2009   Kawakita et al. ............ 257/666
2005/0269674 A1 12/2005  Kawakita et al.

FOREIGN PATENT DOCUMENTS

JP       2004/6506       1/2004
JP       2006-19700      1/2006

* cited by examiner

*Primary Examiner*—Hieu T Vo
(74) *Attorney, Agent, or Firm*—Nixon & Vanderhye PC

(57) ABSTRACT

An ignition coil includes a coil portion and an igniter. The coil portion has a primary coil, a secondary coil, and a coil case. The primary coil and the secondary coil are disposed in the coil case. The igniter is disposed on one end side of the coil portion. The igniter includes a metallic frame connected to a voltage source at a constant potential, and a semiconductor integrated chip disposed on the metallic frame. The semiconductor integrated chip has a control circuit for controlling a switching element. The control circuit is formed by a dielectric isolation method. A surface of the semiconductor integrated chip on a silicon substrate-side is opposed to the metallic frame.

5 Claims, 4 Drawing Sheets

IGNITION COIL

CROSS REFERENCE TO RELATED APPLICATION

This application is based on and incorporates herein by reference Japanese Patent Application No. 2007-15226 filed on Jan. 25, 2007.

BACKGROUND OF THE INVENTION

1. Field of the Invention

The present invention relates to an ignition coil, which is used for generating a spark between a pair of electrodes in a spark plug, in an internal-combustion engine such as a vehicular engine.

2. Description of Related Art

In an ignition coil used in a vehicular engine, for example, a control command from an electronic control unit (ECU) of the engine is transmitted to an igniter having a control circuit for controlling a switching element, and an electric current is passed and cut off through a primary coil of the ignition coil using the igniter.

In the case where the igniter is incorporated in a case of the ignition coil, particularly, in the igniter, a semiconductor integrated chip is packaged in the form of a flip chip on a ceramic substrate, in which a conducting portion constituting the control circuit and the like are formed, and the ceramic substrate is bonded on a lead frame. In the semiconductor integrated chip, an integrated circuit employing a junction isolation method is formed. The ignition coil using such an igniter is disclosed in JP2004-6506A corresponding to U.S. Pat. No. 7,084,729, for example.

In the igniter using the ceramic substrate, when the ceramic substrate and the semiconductor integrated chip are on a coil-side relative to the lead frame, the semiconductor integrated chip is exposed to a high electric field of the coil. In such a case, a silicon substrate surface (P-SUB region on a silicon substrate side) of the semiconductor integrated chip disposed on the coil-side is connected to GND. Thus, the silicon substrate surface is located between the high electric field of the coil and a circuit surface of the semiconductor integrated chip, so that the high electric field hardly has a bad influence on the circuit surface.

A configuration of the igniter using the ceramic substrate is complex and creates rising costs. Accordingly, it is proposed that the ceramic substrate is not used and the semiconductor integrated chip is directly mounted on the lead frame. In this case, the silicon substrate surface of the semiconductor integrated chip is bonded to the lead frame, and circuit elements in the semiconductor integrated chip are connected to each other by wire bonding.

However, in the case where the ceramic substrate is not used, when the circuit surface of the semiconductor integrated chip is disposed facing the coil-side, [the circuit surface is exposed to the high electric field. As a result, a parasitic transistor is generated in the integrated circuit in the semiconductor integrated chip, and thereby malfunctions such as latch-up may occur.

SUMMARY OF THE INVENTION

The present invention addresses the above disadvantages. Thus, it is an objective of the present invention to provide an ignition coil, in which a control circuit in an igniter operates stably even without a ceramic substrate.

To achieve the objective of the present invention, there is provided an ignition coil including a coil portion and an igniter. The coil portion has a primary coil, a secondary coil, and a coil case. The primary coil and the secondary coil are disposed in the coil case. The igniter is disposed on one end side of the coil portion. The igniter includes a metallic frame connected to a voltage source at a constant potential, and a semiconductor integrated chip disposed on the metallic frame. The semiconductor integrated chip has a control circuit for controlling a switching element. The control circuit is formed by a dielectric isolation method. A surface of the semiconductor integrated chip on a silicon substrate-side is opposed to the metallic frame.

To achieve the objective of the present invention, there is also provided an ignition coil including a coil portion and an igniter. The coil portion has a primary coil, a secondary coil, and a coil case. The primary coil and the secondary coil are disposed in the coil case. The igniter is disposed on one end side of the coil portion. The igniter includes a metallic frame connected to a voltage source at a constant potential, and a semiconductor integrated chip disposed on the metallic frame. The semiconductor integrated chip has a control circuit for controlling a switching element. The control circuit is formed by a junction isolation method. A surface of the semiconductor integrated chip on a silicon substrate-side is opposed to the metallic frame. The semiconductor integrated chip is disposed on an outside surface of the metallic frame. The outside surface faces an opposite side of the coil portion.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

First and second embodiments of the invention are described below. A voltage supply at a constant potential, which is connected to a metallic frame, may be at a ground potential or at a constant potential (supply voltage) on a positive side. Preferably, the metallic frame may be connected at low impedance to a voltage supply at a constant potential.

In the first embodiment, a semiconductor integrated chip may be disposed on an inside surface of the frame facing a coil portion-side. In such a case, by forming a control circuit by a dielectric isolation method in the semiconductor integrated chip, the control circuit operates stably. Additionally, the semiconductor integrated chip may be disposed on an outside surface of the frame facing an opposite side of the coil portion.

Preferably, in the first and second embodiments, the frame and the semiconductor integrated chip may be mold-formed using dielectric resin. Accordingly, a stably operable mold igniter is formed.

Embodiments of an ignition coil of the invention will be described below with reference to the accompanying drawings.

First Embodiment

Figure 1:
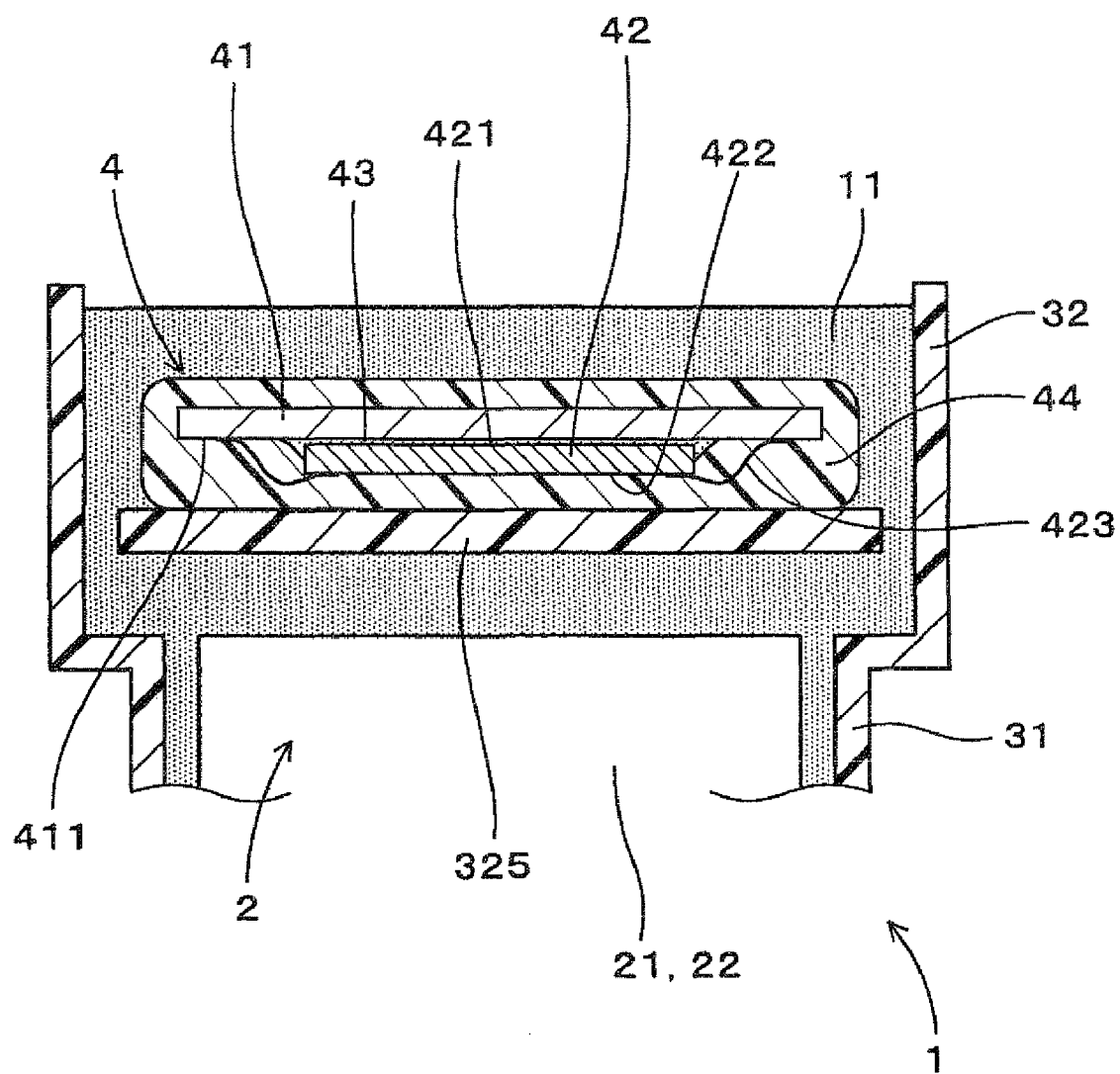
FIG. 1 is a schematic cross-sectional view illustrating an area surrounding an igniter according to a first embodiment of the invention.
Figure 2:
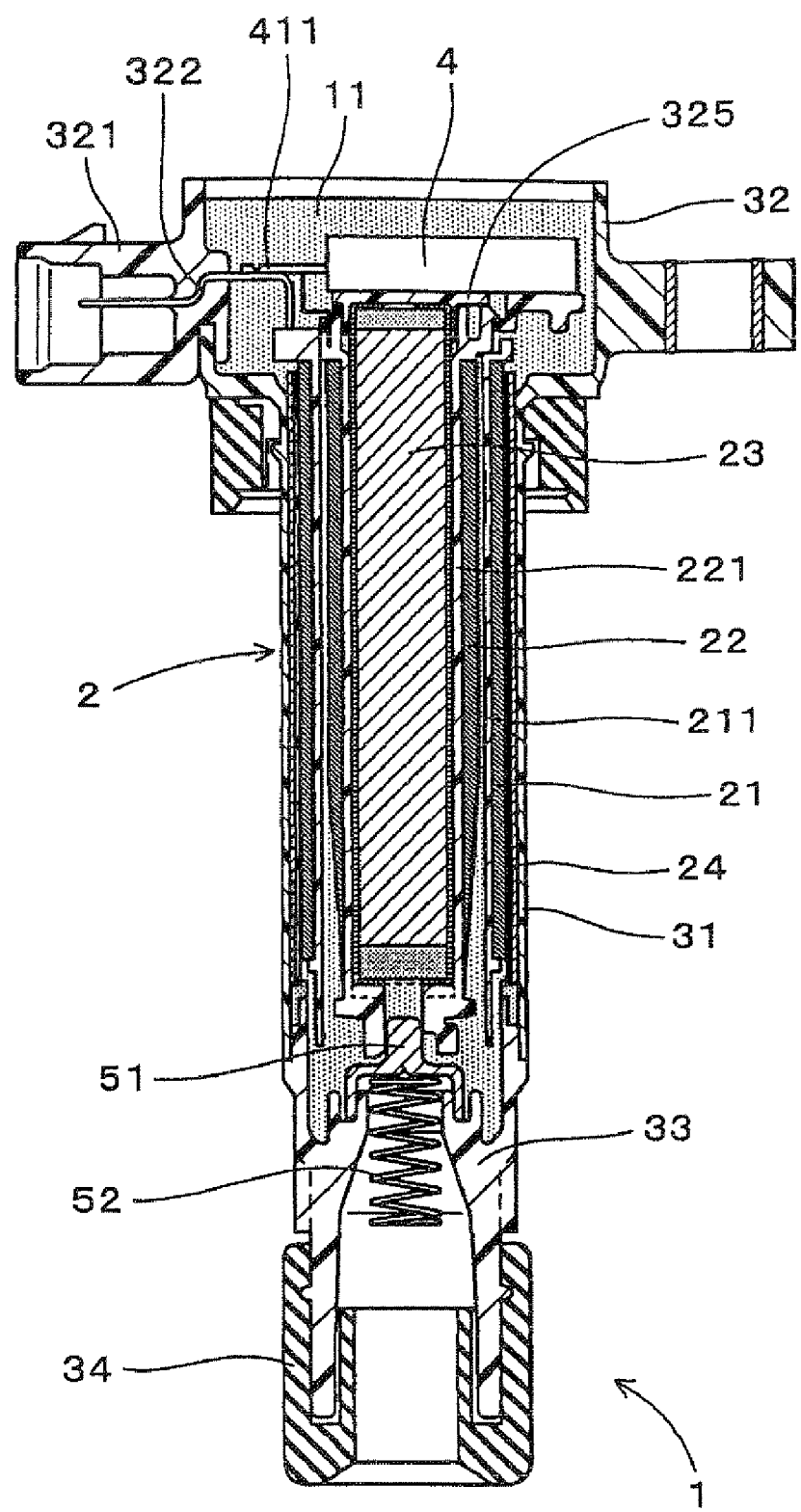
FIG. 2 is a schematic cross-sectional view illustrating an ignition coil according to the first embodiment.

As shown in FIGS. 1, 2, an ignition coil 1 of the first embodiment of the invention includes a coil portion 2 and an igniter 4. The coil portion 2 is formed by disposing a primary coil 21 and a secondary coil 22 in a coil case 31. The igniter 4 is disposed on one end side of the coil portion 2. The igniter 4 is formed by disposing a semiconductor integrated chip 42 on a metallic frame 41 connected to a voltage supply at a constant potential (a ground potential in the first embodiment). The semiconductor integrated chip 42 has a control circuit for controlling a switching element, which is formed by a dielectric isolation method. A silicon substrate surface 421 of the semiconductor integrated chip 42 is opposed to the frame 41 with an adhesive 43 therebetween. The semiconductor integrated chip 42 is disposed on an inside surface 411 of the frame 41 facing a coil portion 2-side.

The ignition coil 1 is described below in detail with reference to FIGS. 1 to 3. As shown in FIG. 2, the ignition coil 1 is of a stick type, which is used by disposing the coil portion 2 having the primary coil 21 and the secondary coil 22 in a plug hole of an engine (cylinder-head cover). A center core 23, which is made of a soft magnetic material, is disposed on an inner circumferential side of the primary coil 21 and the secondary coil 22. An outer circumferential core 24, which is made of a soft magnetic material, is disposed on an outer circumferential side of the primary coil 21 and the secondary coil 22.

The primary coil 21 is wound around a primary spool 211, which has an annulus ring cross-section shape and is made of thermoplastic resin. The secondary coil 22 is formed by winding an electrical wire having a smaller diameter than the primary coil 21 around a secondary spool 221 more than the number of winding times of the primary coil 21. The secondary spool 221 has an annulus ring cross-section shape and is made of thermoplastic resin. The primary coil 21, the secondary coil 22, the center core 23, and the outer circumferential core 24 are received in the coil case 31, which is made of thermoplastic resin.

As shown in FIG. 2, a high voltage tower 33 is connected to a high voltage-side end portion of the coil case 31. The high voltage tower 33 has an annulus ring cross-section shape and is made of thermoplastic resin. The high voltage tower 33 receives a high voltage terminal 51, which is in conduction with a high voltage-side end portion of the secondary coil 22. A plug attachment member 34, which is made of rubber having an annulus ring cross-section shape and is for the attachment of a spark plug thereto, is attached to the high voltage tower 33. A spring 52 is disposed on an inner circumferential side of the plug attachment member 34. The spring 52 is in conduction with the high voltage terminal 51 and in contact with a terminal area of the spark plug attached to the inner circumferential side of the plug attachment member 34.

A connector case portion 32 is formed at a low voltage-side end portion of the coil case 31. The connector case portion 32 has a connector connecting portion 321 for electrically connecting the ignition coil 1 to an electronic control unit (ECU) of the engine. The igniter 4 is disposed in the connector case portion 32, being attached on an attaching portion 325, which is extended from the connector connecting portion 321.

A space in the ignition coil 1, that is, a space surrounded with the connector case portion 32, the coil case 31, and the high voltage tower 33 is filled with a filler 11, which is made of thermosetting resin.

Figure 3:
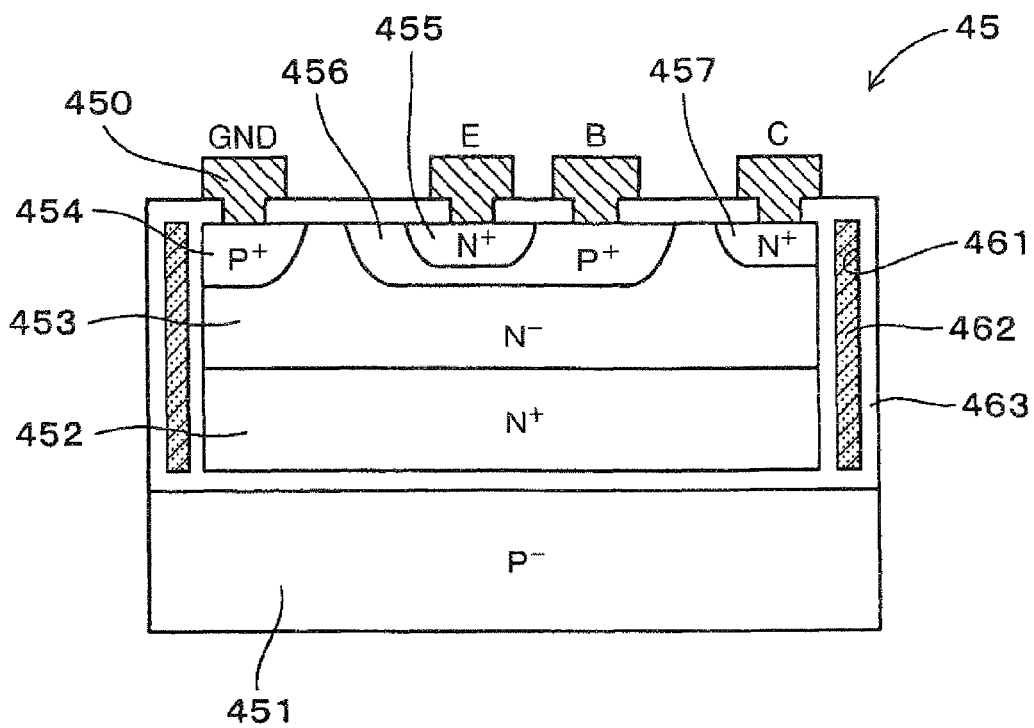
FIG. 3 is a schematic cross-sectional view illustrating a part of a circuit element in a control circuit by a dielectric isolation method according to the first embodiment.

FIG. 3 shows a part of a circuit element in the control circuit by the dielectric isolation method, that is, a transistor 45 formed by the dielectric isolation method. A high-concentrated silicon layer 452 and a low-concentrated silicon layer 453 are stacked on a silicon substrate 451. An excess carrier removing diffusion region 454, an emitter region 455, a base region 456, and a collector region 457 are formed on the low-concentrated silicon layer 453, corresponding to electrodes 450 for a ground (GND), emitter (E), base (B), and collector (C), respectively. The component part of the transistor 45 is electrically separated from component parts of other circuit elements by a polysilicon 462 in a separation groove 461 formed around the component part of the transistor 45 and a dielectric film (silicon dioxide film) 463.

The frame 41 includes a frame main body portion, a ground pin, and conductive pins (not shown). The semiconductor integrated chip 42 is disposed on the frame main body portion. The ground pin is extended from the frame main body portion. The conductive pins are disposed parallel to the ground pin. The ground pin is for maintaining an electric potential of the frame 41 at a ground potential. The conductive pins constitute a positive power supply, a negative power supply, a switching signal line, a sensor signal line, and the like.

When the igniter 4 is disposed in the connector case portion 32 of the ignition coil 1, as shown in FIG. 2, an end portion of the ground pin and end portions of the conductive pins are opposed to an end portion of a connector-side pin 322 in the connector connecting portion 321 formed at the connector case portion 32, and are joined to the connector-side pin 322 by welding or soldering.

The semiconductor integrated chip 42 includes circuit elements such as a control integrated circuit, a switching element, a capacitor, and a diode (not shown). A bonding wire 423 is connected between the circuit elements or between the circuit element and the end portion of the conductive pin. In addition, the circuit elements may be formed integrally in a single semiconductor integrated chip 42, or may be formed separately in a plurality of semiconductor integrated chips 42.

Using a dielectric mold resin 44, the frame 41 and the semiconductor integrated chip 42 are mold-formed, being bonded together with the adhesive 43 therebetween (FIG. 1). The mold resin 44 covers the entire frame main body portion, all the circuit elements, all the bonding wires 423, the end portions of the conductive pins, and the end portion of the ground pin.

When an electric current is passed through the primary coil 21 in response to a pulsed spark generating signal from the ECU, a magnetic field passing through the center core 23 and the outer circumferential core 24 is formed. Subsequently, when the electric current passed through the primary coil 21 is cut off, a voltage is generated in the primary coil 21 due to a self-induction effect, and high-voltage induced electromotive force is generated in the secondary coil 22 due to a mutual induction effect. Accordingly, a spark is generated between a pair of electrodes in the spark plug attached to the ignition coil 1.

In the ignition coil 1, the igniter 4 is formed using the semiconductor integrated chip 42 having the control circuit formed by the dielectric isolation method. In the igniter 4, the silicon substrate surface (surface on a silicon substrate-side)

421 of the semiconductor integrated chip 42 is opposed to the frame 41, which is connected to a ground potential, with the adhesive 43 therebetween. Accordingly, the igniter 4 is formed without a ceramic substrate.

Furthermore, by virtue of the above configuration, In the ignition coil 1 having the igniter 4, even though a circuit surface (surface on a circuit elements-side) 422 of the semiconductor integrated chip 42 is exposed to a high electric field generated by the coil portion 2, the formation of a parasitic transistor in the control circuit is prevented, because the circuit elements such as the switching element, which constitute the control circuit by the dielectric isolation method, are insulated and separated from each other. Accordingly, the control circuit operates stably.

As a result, although the ceramic substrate is not used in the ignition coil 1, the control circuit in the igniter 4 operates stably.

Second Embodiment

Figure 4:
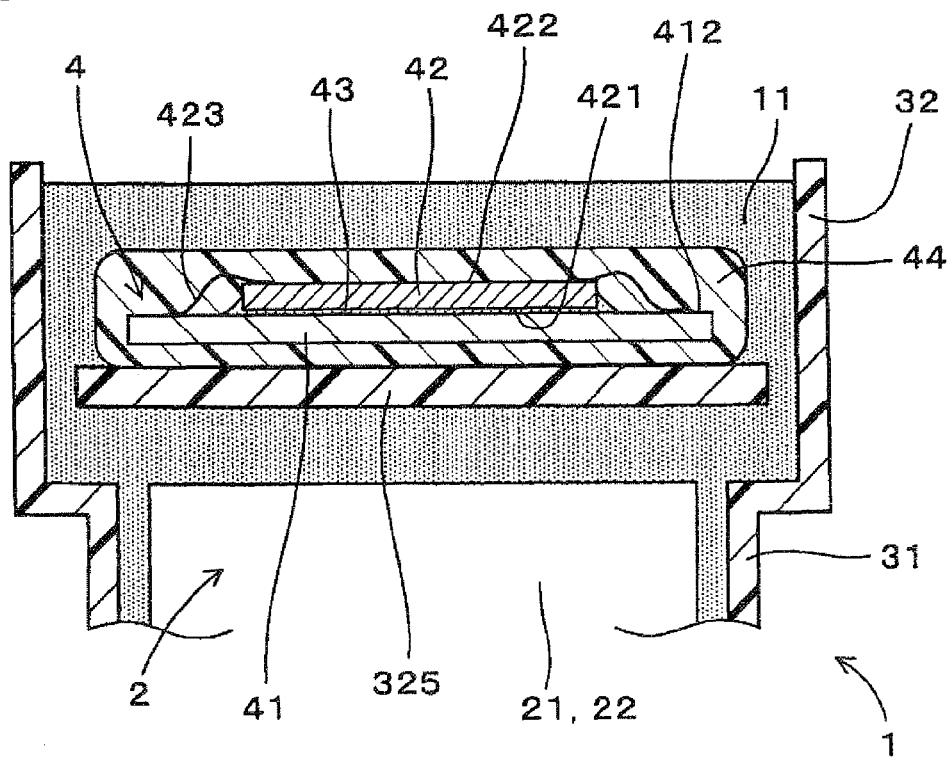
FIG. 4 is a schematic cross-sectional view illustrating an area surrounding an igniter according to a second embodiment of the invention.
Figure 5:
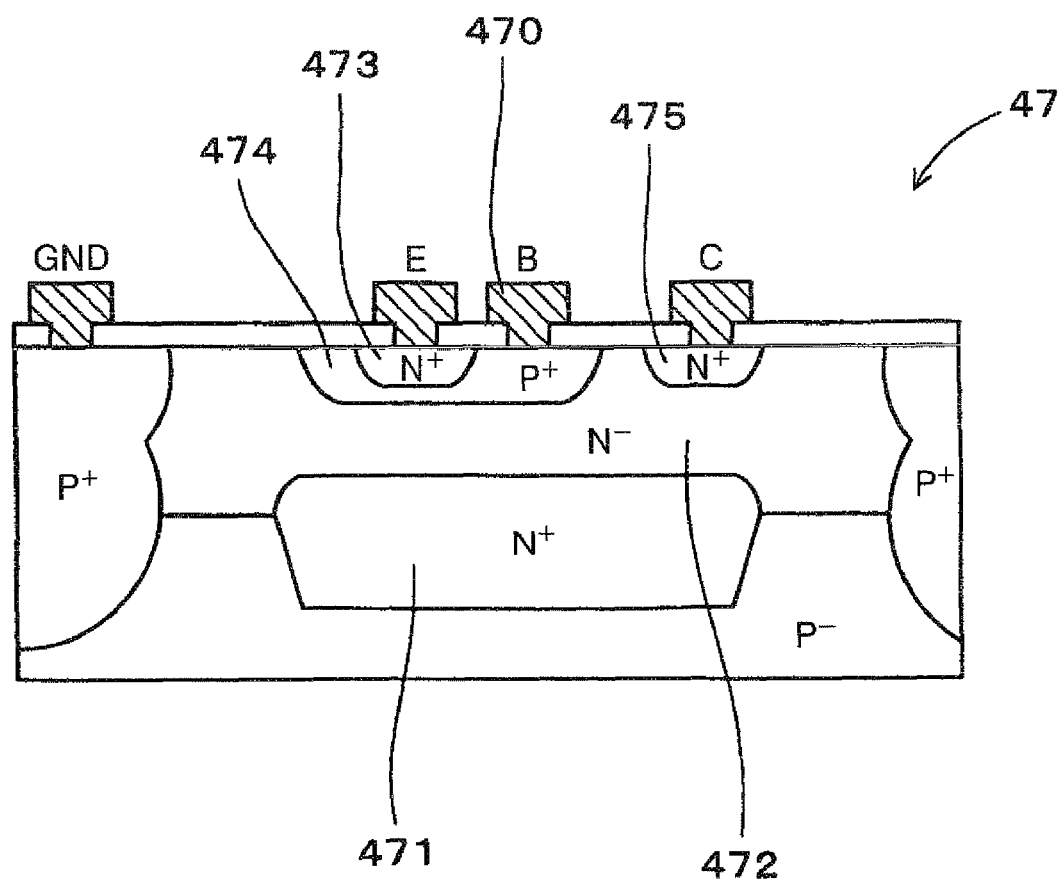
FIG. 5 is a schematic cross-sectional view illustrating a part of a circuit element in a control circuit by a junction isolation method according to the second embodiment.

FIGS. 4, 5 show the second embodiment of the invention, in which a semiconductor integrated chip 42 is bonded to a metallic frame 41 using an adhesive 43. The semiconductor integrated chip 42 has a control circuit for controlling a switching element, which is formed by a junction isolation method. A silicon substrate surface 421 of the semiconductor integrated chip 42 is opposed to the frame 41, and the semiconductor integrated chip 42 is disposed on an outside surface 412 of the frame 41 facing an opposite side of a coil portion 2.

FIG. 5 shows a part of a circuit element in the control circuit by the junction isolation method, that is, a transistor 47 formed by the junction isolation method. In FIG. 5, a high-concentrated silicon layer 471 and a low-concentrated silicon layer 472 are appropriately formed, and an emitter region 473, a base region 474, and a collector region 475 are formed in the low-concentrated silicon layer 472 corresponding to electrodes 470 for an emitter (E), base (B), and collector (C), respectively.

In an ignition coil 1 of the second embodiment, an igniter 4 is formed using the semiconductor integrated chip 42 having the control circuit formed by the junction isolation method. In the igniter 4, the silicon substrate surface (surface on a silicon substrate-side) 421 of the semiconductor integrated chip 42 is opposed to the frame 41, which is connected to a ground potential, with the adhesive 43 therebetween. Furthermore, the semiconductor integrated chip 42 is disposed on the outside surface 412 of the frame 41 facing the opposite side of the coil portion 2. Accordingly, the igniter 4 is formed without a ceramic substrate.

Moreover, by virtue of the above configuration, the frame 41 connected to the ground potential serves as a shield plate, in the ignition coil 1 having the igniter 4. More specifically, the frame 41 prevents a bad influence of a high electric field generated by the coil portion 2 on a circuit surface (surface on a circuit elements-side) 422 of the semiconductor integrated chip 42. As a result, the formation of a parasitic transistor in the control circuit by the junction isolation method in the semiconductor integrated chip 42 is prevented, and thereby the control circuit operates stably.

Thus, although the ceramic substrate is not used in the ignition coil 1 of the second embodiment as well, the control circuit in the igniter 4 operates stably.

In the second embodiment, the other configurations are similar to the first embodiment, and a similar operation/working-effect to the first embodiment is produced.

Additional advantages and modifications will readily occur to those skilled in the art. The invention in its broader terms is therefore not limited to the specific details, representative apparatus, and illustrative examples shown and described.

What is claimed is:

1. An ignition coil comprising:
   a coil portion having a primary coil, a secondary coil, and a coil case, wherein the primary coil and the secondary coil are disposed in the coil case; and
   an igniter disposed on one end side of the coil portion, wherein:
   the igniter includes a metallic frame connected to a voltage source at a constant potential, and a semiconductor integrated chip disposed on the metallic frame;
   the semiconductor integrated chip has a control circuit for controlling a switching element;
   the control circuit is formed by a dielectric isolation method; and
   a surface of the semiconductor integrated chip on a silicon substrate-side is opposed to the metallic frame.

2. The ignition coil according to claim 1, wherein:
   the semiconductor integrated chip is deposed on an inside surface of the metallic frame, and
   the inside surface faces the coil portion.

3. The ignition coil according to claim 1, wherein the metallic frame and the semiconductor integrated chip are mold-formed using a dielectric resin.

4. An ignition coil comprising:
   a coil portion having a primary coil, a secondary coil, and a coil case, wherein the primary coil and the secondary coil are disposed in the coil case; and
   an igniter disposed on one end side of the coil portion, wherein:
   the igniter includes a metallic frame connected to a voltage source at a constant potential, and a semiconductor integrated chip disposed on the metallic frame;
   the semiconductor integrated chip has a control circuit for controlling a switching element;
   the control circuit is formed by a junction isolation method;
   a surface of the semiconductor integrated chip on a silicon substrate-side is opposed to the metallic frame;
   the semiconductor integrated chip is disposed on an outside surface of the metallic frame; and
   the outside surface faces an opposite side of the coil portion.

5. The ignition coil according to claim 4, wherein the metallic frame and the semiconductor integrated chip are mold-formed using a dielectric resin.

* * * * *